(12) United States Patent
Koduri

(10) Patent No.: US 12,074,098 B2
(45) Date of Patent: Aug. 27, 2024

(54) THREE-DIMENSIONAL FUNCTIONAL INTEGRATION

(71) Applicant: Texas Instruments Incorporated, Dallas, TX (US)

(72) Inventor: Sreenivasan K. Koduri, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/308,648

(22) Filed: Apr. 27, 2023

(65) Prior Publication Data

US 2023/0260879 A1 Aug. 17, 2023

Related U.S. Application Data

(62) Division of application No. 16/457,941, filed on Jun. 29, 2019, now Pat. No. 11,682,609.

(51) Int. Cl.
| | |
|---|---|
| *H01L 23/495* | (2006.01) |
| *H01L 23/00* | (2006.01) |
| *H01L 23/31* | (2006.01) |
| *H01L 23/498* | (2006.01) |
| *H05K 3/34* | (2006.01) |

(52) U.S. Cl.
CPC .... *H01L 23/49562* (2013.01); *H01L 23/3107* (2013.01); *H01L 23/49555* (2013.01); *H01L 23/49805* (2013.01); *H01L 24/48* (2013.01); *H01L 24/49* (2013.01); *H05K 3/3426* (2013.01); *H01L 2224/48091* (2013.01); *H01L 2224/48247* (2013.01); *H01L 2924/14* (2013.01)

(58) Field of Classification Search
CPC .............................................. H01L 23/49562
See application file for complete search history.

(56) References Cited

U.S. PATENT DOCUMENTS

| 5,012,386 | A | | 4/1991 | McShane et al. |
| 5,105,261 | A | | 4/1992 | Ueda et al. |
| 5,160,810 | A | * | 11/1992 | Rohde ...................... H01L 23/10 |
| | | | | 174/50.56 |
| 5,436,500 | A | * | 7/1995 | Park .................... H01L 23/3107 |
| | | | | 361/767 |
| 5,471,369 | A | * | 11/1995 | Honda .............. H01L 23/49575 |
| | | | | 361/813 |

(Continued)

*Primary Examiner* — William A Harriston
(74) *Attorney, Agent, or Firm* — Ronald O. Neerings; Frank D. Cimino

(57) ABSTRACT

A packaged electronic device includes a package structure with opposite first and second sides spaced apart from one another along a first direction, and opposite third and fourth sides spaced apart from one another along a second direction, as well as first and second leads. The first lead includes a first portion that extends outward from the third side of the package structure and extends downward toward a plane of the first side and away from a plane of the second side. The second lead includes a first portion that extends outward from the third side of the package structure, and the second lead extends upward toward the plane of the second side and away from the plane of the first side to allow connection to another circuit or component, such as a second packaged electronic device, a passive circuit component, a printed circuit board, etc.

21 Claims, 15 Drawing Sheets

(56) References Cited

U.S. PATENT DOCUMENTS

| | | | |
|---|---|---|---|
| 5,583,371 A * | 12/1996 | Hori | H01L 23/4334 |
| | | | 257/796 |
| 5,625,221 A * | 4/1997 | Kim | H01L 25/105 |
| | | | 257/E25.023 |
| 5,835,988 A * | 11/1998 | Ishii | H01L 23/3107 |
| | | | 438/126 |
| 5,866,939 A * | 2/1999 | Shin | H01L 23/3114 |
| | | | 257/E23.047 |
| 5,986,209 A * | 11/1999 | Tandy | H01L 23/4951 |
| | | | 174/533 |
| D461,172 S * | 8/2002 | Harnden | D13/182 |
| 6,914,332 B2 | 7/2005 | Zuniga-Ortiz et al. | |
| 7,517,733 B2 * | 4/2009 | Camacho | H01L 23/49811 |
| | | | 438/123 |
| 7,633,140 B2 * | 12/2009 | Luo | H01L 24/37 |
| | | | 257/787 |
| 9,013,032 B2 | 4/2015 | Koduri | |
| 9,484,289 B2 * | 11/2016 | Ge | H01L 23/4334 |
| 9,936,576 B2 * | 4/2018 | Ang | H01L 23/49575 |
| 2003/0062601 A1 * | 4/2003 | Harnden | H05K 3/3426 |
| | | | 257/E23.044 |
| 2005/0127532 A1 * | 6/2005 | Luo | H01L 24/48 |
| | | | 257/E23.044 |
| 2006/0049492 A1 | 3/2006 | Holloway et al. | |
| 2006/0237828 A1 | 10/2006 | Robinson et al. | |
| 2007/0108568 A1 * | 5/2007 | Shim | H01L 25/105 |
| | | | 257/676 |
| 2008/0029907 A1 | 2/2008 | Koduri | |
| 2011/0024895 A1 | 2/2011 | Koduri et al. | |
| 2011/0033985 A1 | 2/2011 | Udompanyavit et al. | |
| 2012/0086112 A1 | 4/2012 | Amaro et al. | |
| 2012/0126385 A1 | 5/2012 | Koduri | |
| 2012/0217044 A1 | 8/2012 | Koduri | |
| 2013/0020695 A1 * | 1/2013 | Na | H01L 23/49555 |
| | | | 257/E21.705 |
| 2013/0307117 A1 | 11/2013 | Koduri | |
| 2014/0008737 A1 * | 1/2014 | Koduri | B81B 7/0054 |
| | | | 438/51 |
| 2014/0124939 A1 | 5/2014 | Romig et al. | |
| 2015/0228566 A1 | 8/2015 | Koduri | |
| 2018/0301403 A1 | 10/2018 | Morroni et al. | |
| 2019/0109016 A1 | 4/2019 | Koduri | |
| 2019/0109076 A1 | 4/2019 | Koduri | |
| 2019/0109108 A1 | 4/2019 | Koduri | |

* cited by examiner

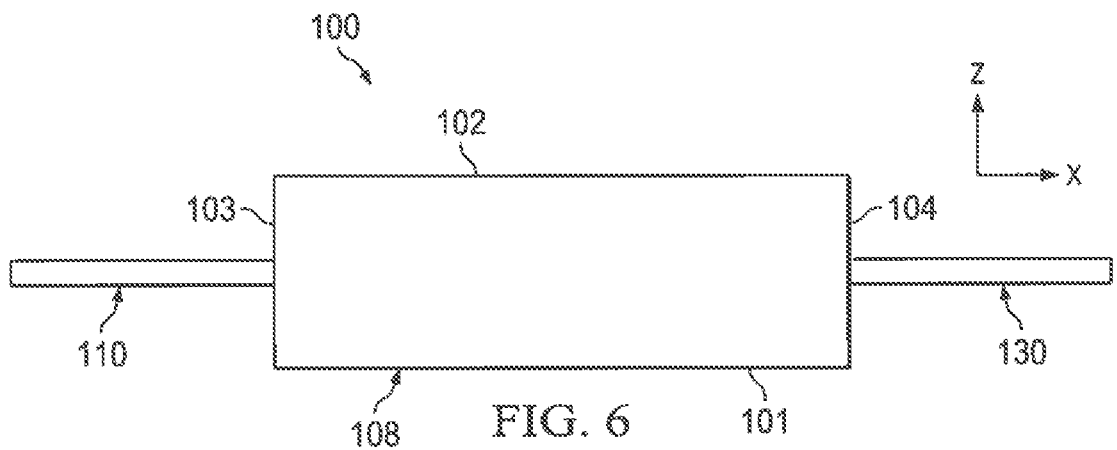
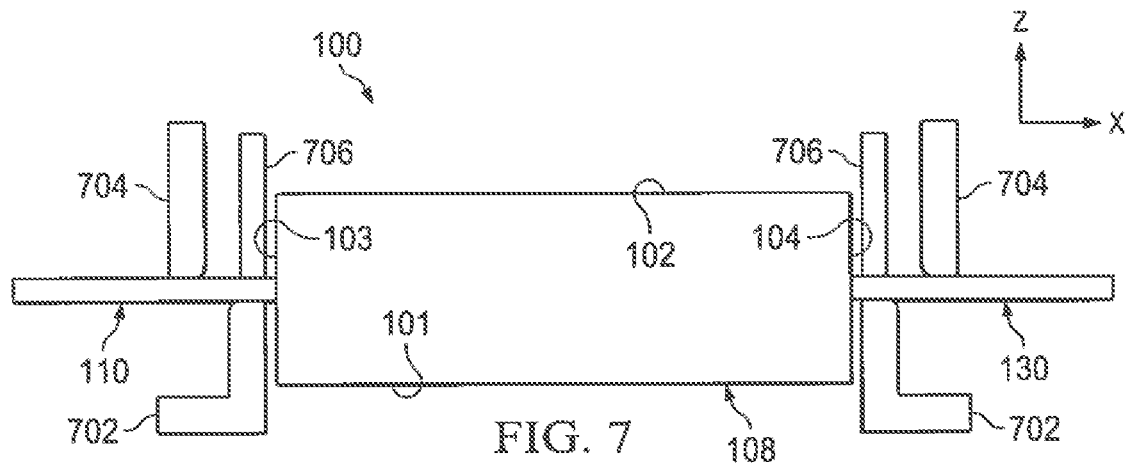
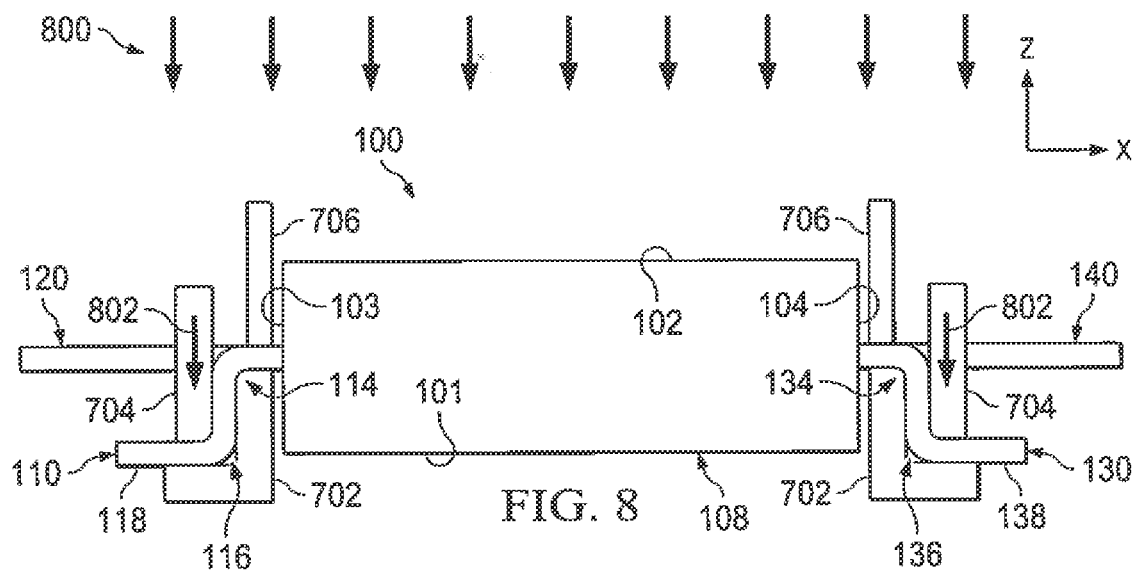

THREE-DIMENSIONAL FUNCTIONAL INTEGRATION

This application is a division of patent application Ser. No. 16/457,941, filed Jun. 29, 2019, the contents of which are herein incorporated by reference in its entirety.

BACKGROUND

The trend towards higher functional density in packaged electronic devices has led to development of a variety of dense interconnection technologies for mounting integrated circuits or other devices to a printed circuit board (PCB). For example, smart phones and other personal devices use ball grid array (BGA), through silicon via (TSV), package on package (POP) and other technologies to improve functional density. However, these solutions may suffer from reduced reliability through susceptibility to shock and vibration and other conditions found in many applications, including industrial automation, automotive, aviation, etc. Industrial and automotive applications increasingly require higher functional density, but the use of BGA based packages can lead to solder joint cracking and other reliability concerns. For many industrial, automotive and other infrastructure applications, very robust products are needed because the lifetimes and operating conditions can be demanding.

SUMMARY

In one aspect, an electronic device includes a package structure, one or more upwardly extending leads, and one or more downwardly extending leads to facilitate vertical integration by top and bottom connections to other circuits or components. In another aspect, an electronic assembly includes a packaged electronic device with a package structure, a downwardly extending first lead, and an upwardly extending second lead, along with a circuit or component electrically connected to the second lead. In another aspect, a method includes forming a package structure to enclose portions of a first lead and a second lead, bending the first lead downward, and bending the second lead upward.

BRIEF DESCRIPTION OF THE DRAWINGS

FIGS. 6-11 are side elevation views of the example packaged electronic device of FIG. 1 undergoing fabrication processing according to the method of FIG. 5.

DETAILED DESCRIPTION

Figure 1:
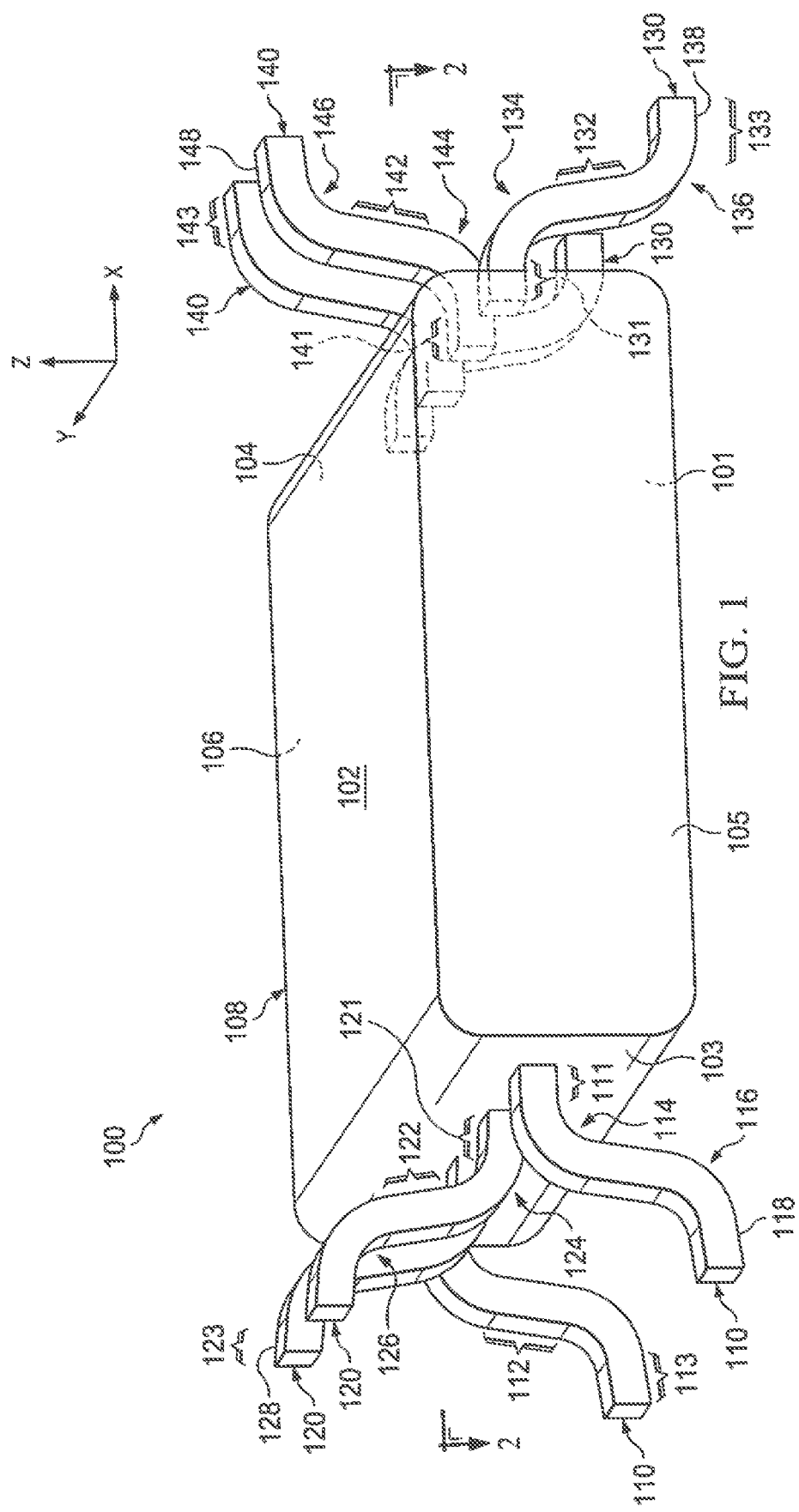
FIG. 1 is a perspective view of a packaged electronic device with upper and lower gull wing leads according to a first embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
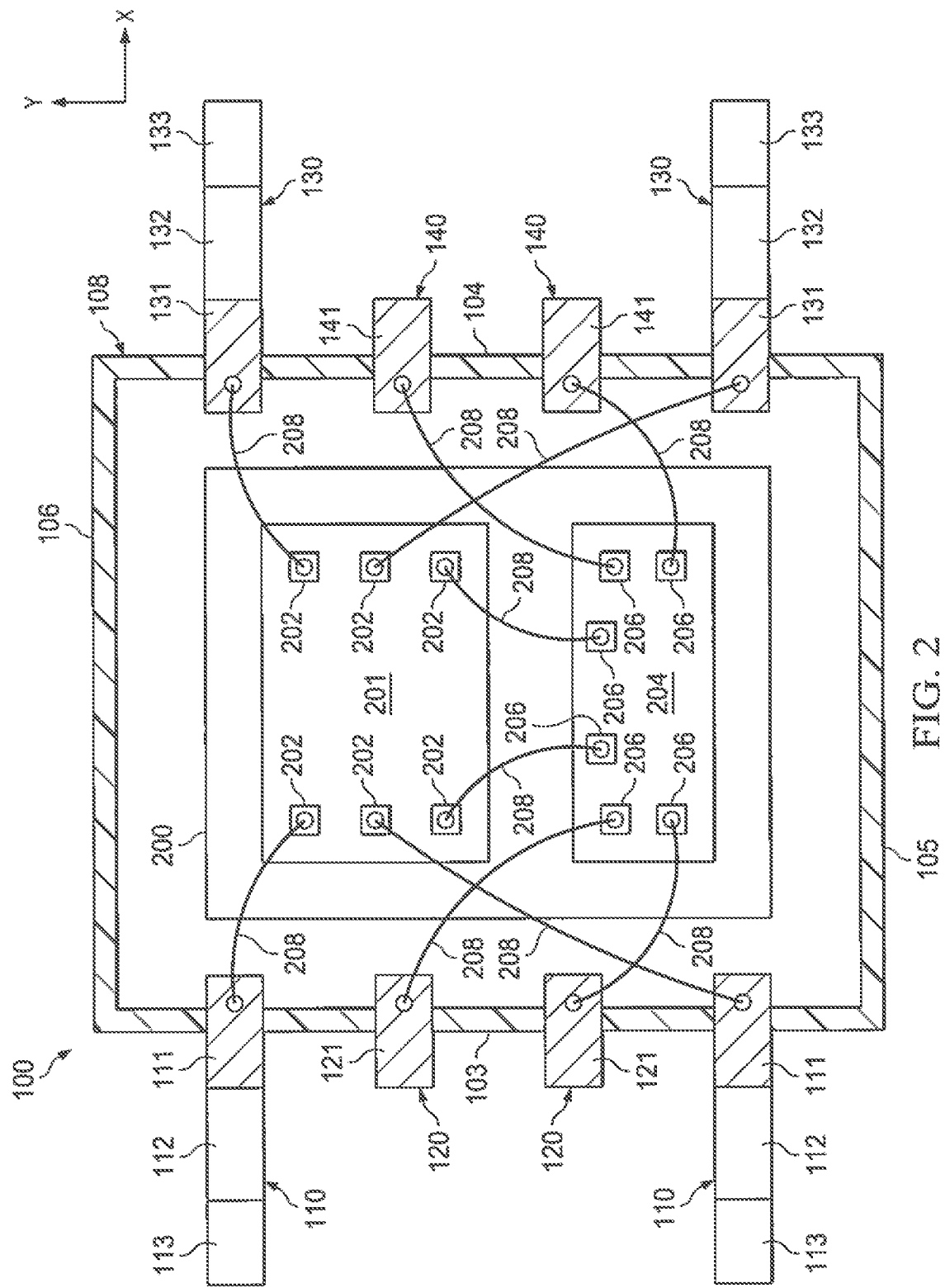
FIG. 2 is a sectional top view of the packaged electronic device taken along line 2-2 in FIG. 1.

FIGS. 1 and 2 show an example electronic device 100, such as an integrated circuit or a single circuit component in a molded plastic or ceramic package structure. FIG. 2 shows a sectional top view of the electronic device 100 taken along line 2-2 in FIG. 1. Described examples include vertically integrated electronic assemblies with packaged electronic devices having upwardly and downwardly extending leads for vertical integration with a second packaged electronic device, a passive circuit component, a printed circuit board, etc. Described examples combine one or more upwardly extending leads for vertical circuit assembly integration with one or more gull wing or J-type downwardly extending leads that provide protection against shock, vibration and other conditions in industrial automation, automotive, aviation, infrastructure and other applications. The described examples provide solutions for increased circuit density in combination with structural robustness to facilitate proliferation of electronics into various operations for industrial, automotive, infrastructure, and avionics applications to utilize vertical (e.g., Z-axis) space on a host circuit board assembly where integrated circuits (ICs) are generally not the thickest components on a circuit board.

The electronic device 100 in FIGS. 1 and 2 includes a first (e.g., bottom or lower) side 101 and an opposite second side 102 (e.g., top or upper side) spaced apart from the first side 101 along a first direction (e.g., the positive Z direction in FIG. 1). The electronic device 100 also includes a third side 103 (e.g., the left side in FIGS. 1 and 2), and an opposite fourth side 104 (e.g., the right side in FIGS. 1 and 2) that is spaced apart from the third side 103 along a second direction (e.g., the X direction in FIGS. 1 and 2). The second direction is orthogonal to the first direction. The example electronic device 100 has a generally rectangular shape, although not a requirement of all possible implementations. The example electronic device 100 has a fifth side 105 (e.g., a front side in FIG. 1) and an opposite sixth side 106 (e.g., the back side) that is spaced apart from the fifth side 105 along a third direction (e.g., the Y direction in FIG. 1). The third direction is orthogonal to the first and second directions in this example. The electronic device 100 includes a package structure 108 that defines the sides 101, 102, 103, 104, 105 and 106. In one example, the package structure 108 is a molded plastic. In another example, the package structure 108 is made of a ceramic or other electrically insulating solid material.

The electronic device 100 includes a pair of outer first leads 110 that extend out of the third side 103. In other examples, a single first lead 110 is provided. Each of the first leads 110 includes a first portion 111, a second portion 112, and a third portion 113. The first portion 111 extends outward from the third side 103 along the second direction (X). The first lead 110 includes a first bend 114 (e.g., downward) between the respective first and second portions 111 and 112. The second portion 112 extends downward from the first portion 111 and from the first bend 114 toward a plane of the lower first side 101 and away from a plane of the upper second side 102. The second portion 112 in one example extends generally parallel to the first direction, such as within about 15 degrees of the Z direction in FIG. 1. Each first lead 110 also includes a second bend 116 between the second portion 112 and the third portion 113. The third portion 113 extends from the second portion 112 and from the second bend 116 generally outward from the package structure 108 generally parallel to the second direction, such as within about 15 degrees of the X direction in FIG. 1. The third portion 113 includes a first surface 118 spaced apart from and beyond the plane of the first side 101 so as to extend below the lower first side 101. This allows the first surface 118 of the first lead 110 to be soldered to a host circuit board or to another packaged electronic device (not shown) while the first side 101 of the package structure 108 remains spaced from the host circuit board or other packaged electronic device.

The electronic device 100 includes a pair of inner second leads 120 that extend out of the third side 103. In other examples, a single second lead 120 is provided. The second leads 120 in one example are positioned between the outer first leads 110 along the third direction, although not a requirement of all possible implementations. Each of second leads 120 includes a first portion 121, a second portion 122, and a third portion 123. Each of the second leads 120 includes a first portion 121, a second portion 122, and a third portion 123. The first portion 121 extends outward from the third side 103 along the second direction (X). The second lead 120 includes a first bend 124 (e.g., upward) between the respective first and second portions 121 and 122. The second portion 122 extends upward from the first portion 121 and from the first bend 124 toward the plane of the second side 102 and away from the plane of the first side 101. The second portion 122 in one example extends generally parallel to the first direction, such as within about 15 degrees of the Z direction in FIG. 1. Each second lead 120 also includes a second bend 126 between the second portion 122 and the third portion 123. The third portion 123 extends from the second portion 122 and from the second bend 126 generally outward from the package structure 108 generally parallel to the second direction, such as within about 15 degrees of the X direction in FIG. 1. The third portion 123 includes a second surface 128 spaced apart from and beyond the plane of the second side 102 so as to extend above the upper second side 102. This allows the second surface 128 of the second lead 120 to be soldered to a second packaged electronic device, a passive circuit component, a printed circuit board, etc. (not shown) for vertical integration in an electronic assembly. The third portion 123 extends outwardly to form a gull wing type second lead 120, although not a requirement of all possible implementations. In another example, the second lead 120 can include an inwardly extending third portion to provide a J-type second lead, as described below in connection with FIGS. 18 and 19.

The electronic device 100 includes further leads that extend upwardly and downwardly from the fourth side 14, although not a requirement of all possible implementations. The example electronic device 100 of FIGS. 1 and 2 includes two third leads 130, each including a first portion 131, a second portion 132, and a third portion 133. The first portion 111 extends outward from the third side 103 along the second direction (X). The third lead 130 includes a first bend 134 (e.g., downward) between the respective first and second portions 131 and 132. The second portion 132 extends downward from the first portion 131 and from the first bend 134 toward the plane of the lower first side 101 and away from the plane of the upper second side 102. The second portion 132 in one example extends generally parallel to the first direction, such as within about 15 degrees of the Z direction in FIG. 1. Each third lead 130 also includes a second bend 136 between the second portion 132 and the third portion 133. The third portion 133 extends from the second portion 132 and from the second bend 136 generally outward from the package structure 108 generally parallel to the second direction, such as within about 15 degrees of the X direction in FIG. 1. The third portion 133 includes a third surface 138 spaced apart from and beyond the plane of the first side 101 so as to extend below the lower first side 101. This allows the third surface 138 of the third leads 130 to be soldered to a host circuit board or to another packaged electronic device (not shown) while the first side 101 of the package structure 108 remains spaced from the host circuit board or other packaged electronic device.

The example electronic device 100 of FIGS. 1 and 2 also includes two fourth leads 140 between the third leads 130 on the fourth side 104. Each of fourth leads 140 includes a first portion 141, a second portion 142, and a third portion 143. The first portion 141 extends outward from the fourth side 104 along the second direction (X). The fourth lead 140 includes a first bend 144 (e.g., upward) between the respective first and second portions 141 and 142. The second portion 142 extends upward from the first portion 141 and from the first bend 144 toward the plane of the second side 102 and away from the plane of the first side 101. The second portion 142 in one example extends generally parallel to the first direction, such as within about 15 degrees of the Z direction in FIG. 1. Each fourth lead 140 also includes a second bend 146 between the second portion 142 and the third portion 143. The third portion 143 extends from the second portion 142 and from the second bend 146 generally outward from the package structure 108 generally parallel to the second direction, such as within about 15 degrees of the X direction in FIG. 1. The third portion 143 includes a second surface 148 spaced apart from and beyond the plane of the second side 102 so as to extend above the upper second side 102. This allows the fourth surface 148 of the fourth lead 140 to be soldered to a second packaged electronic device, a passive circuit component, a printed circuit board, etc. (not shown) for vertical integration in an electronic assembly. The third portion 143 extends outwardly away from the package structure 108 to form a gull wing type fourth lead 140, although not a requirement of all possible implementations. In another example, the fourth lead 140 can include an inwardly extending third portion that extends back toward the package structure 108 to provide a J-type fourth lead.

FIG. 2 shows a sectional top view of the packaged electronic device 100 taken along line 2-2 in FIG. 1. In this example, the packaged electronic device 100 is a packaged integrated circuit (IC) with a die attach pad 200 and a first semiconductor die 201 mounted to the die attach pad 200. The first semiconductor die 201 includes conductive die pads 202 on a top surface thereof. A second semiconductor die 204 is mounted to the die attach pad 200 and includes conductive die pads 206 on a top surface thereof. Bond wires 208 are soldered to the die pads 202 and 206 to provide electrical connections between die pads and the first portions 111, 121, 131 and 141 of respective ones of the device leads 110, 120, 130 and 140. The package structure 108 encloses the die attach pad 200, the first and second semiconductor dies 201 and 204 and associated die pads 202 and 206, the bond wires 208, and inner areas of the first lead portions 111, 121, 131 and 141.

Figure 3:
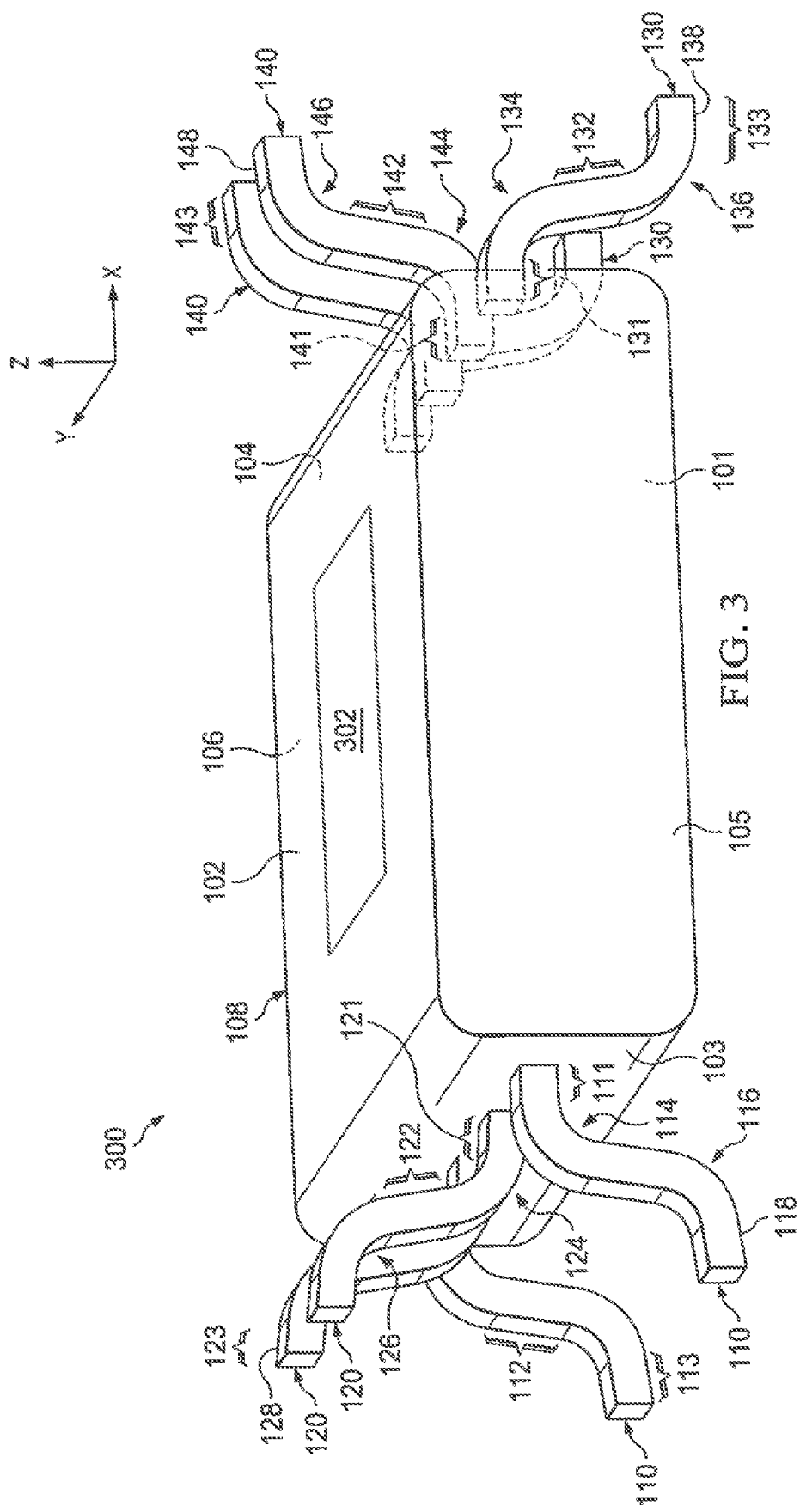
FIG. 3 is a perspective view of a packaged electronic device with upper and lower gull wing leads, and upper and lower thermal pads according to a second embodiment.
Figure 4:
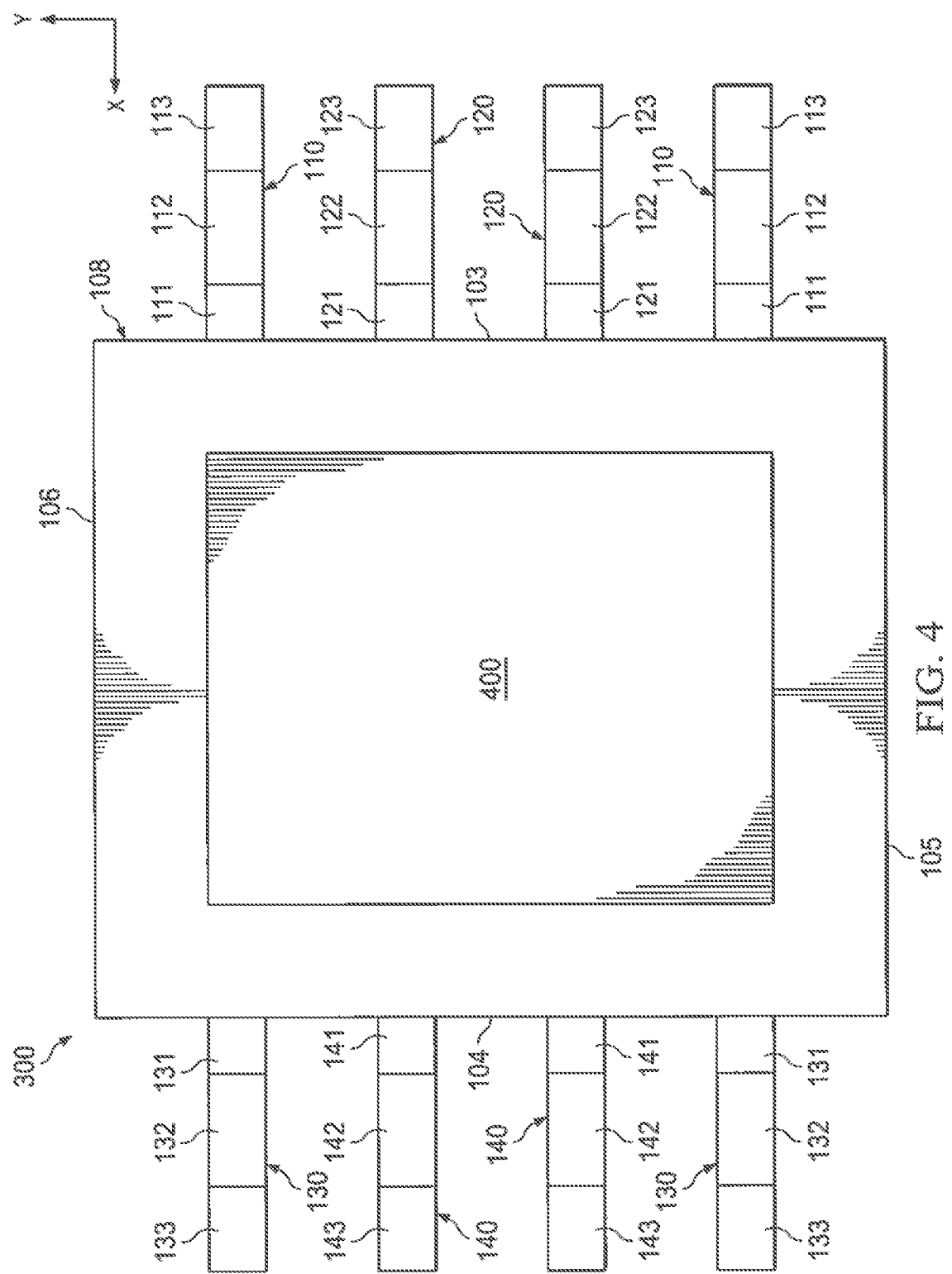
FIG. 4 is a bottom view of the packaged electronic device of FIG. 1.
Figure 5:
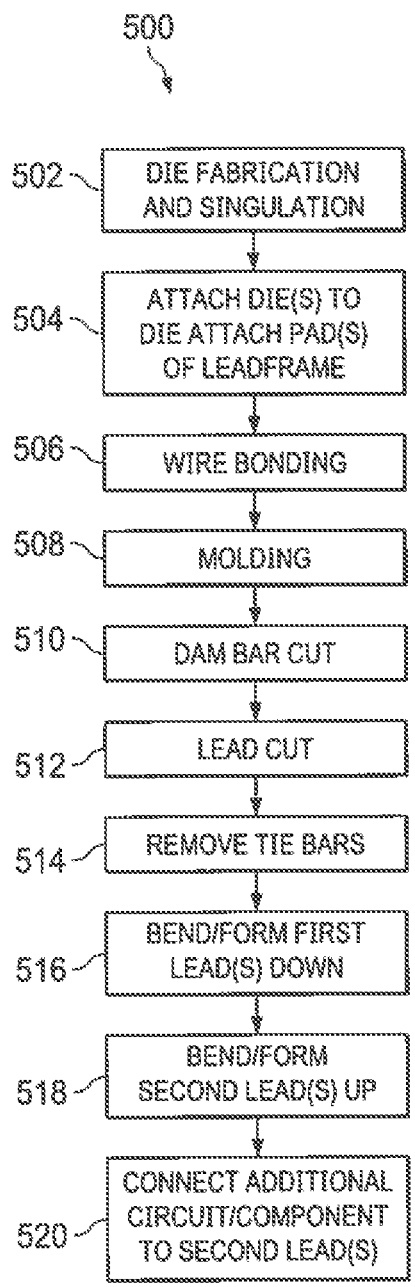
FIG. 5 is a flow diagram of a method for making a packaged electronic device.

FIGS. 3 and 4 show another packaged electronic device 300 with a generally rectangular package structure 108 with sides 101-106, as well as lower gull wing leads 110 and 130 and upper gull wing leads 120 and 140 as described in connection with FIGS. 1 and 2. The electronic device 300 in FIGS. 3 and 4 also includes a conductive upper thermal pad 302 (FIG. 3) exposed along the upper second side 102, as well as a lower conductive thermal pad 400 (FIG. 4) exposed along the lower first side 101. The thermal pads can be any pad on a landing surface of the package structure 108 that is electrically and mechanically connected to an underlying PCB for an overlying component or circuit for improving board level reliability (BLR). The upper thermal pad 302 provides thermal dissipation through the upper second side 102 and can be soldered to a heat sink (not shown). The example lower thermal pad 400 provides thermal dissipation through the lower first side 101 and can be soldered to a circuit board or other underlying structure (not shown). In other implementations, a thermal pad is included in only one of the first and second sides 101 and 102. In other implementations, more than one thermal pad is included in either or both of the first and second sides 101 and/or 102.

In various possible implementations, the packaged electronic devices 100, 300 can be constructed as any suitable package form and structure, such as a small outline integrated circuit (e.g., narrow, wide or mini SOIC), a heat sink or high temperature (e.g., thermally enhanced) small outline integrated circuit (HTSOIC or RHTSOIC), a small outline J-deleted package (SOJ), a small outline package (SOP), such as a shrink small-outline package (SSOP), a thin small-outline package (TSOP), a thin-shrink small-outline package (TSSOP or HTSSOP), a heat sink or high temperature (e.g., thermally enhanced) thin-shrink small-outline package (HTSSOP or RHTSSOP), a small outline transistor (SOT), etc.

Referring also to FIGS. 5-11, FIG. 5 shows a method 500, which can be employed in fabricating the electronic devices 100 and 300 of FIGS. 1-4 or other electronic devices having upward and downward extending gull wing and/or J-type leads. FIGS. 6-11 illustrate the electronic device 100 of FIGS. 1 and 2 undergoing fabrication processing generally according to the method 500. In one example, the semiconductor device fabrication uses standard processing steps with a modified process after lead trimming to form upward and downward extending leads (e.g., leads 110, 120, 130 and 140 in FIGS. 1-4 above). The method 500 begins in FIG. 5 with die fabrication and die singulation at 502, for example, to produce the semiconductor dies 201 and 204 in FIG. 2.

The method 500 continues at 504 with providing a lead frame with leads and one or more die attach pads (e.g., unbent leads 110, 120, 130 and 140, and die attach pad 200 in FIG. 2 above). In one example, the starting lead frame includes sections that respectively correspond to a finished electronic device, and multiple sections may be processed concurrently. The lead frame including the unbent leads 110, 120, 130 and 140, and the die attach pad 200 in one example is a copper structure formed by suitable stamping operations. In one example, the starting lead frame includes one or more support arms (not shown) that support the die attach pad 200. Such support arm or arms can be connected to portions of the lead frame to support the die attach pad 200 during and after manufacturing or can be removed during manufacturing. In another example, the die attach pad 200 is supported relative to the lead portions using an adhesive carrier or tape (not shown) to support the pad 200.

The method 500 continues at 504 with attaching the semiconductor die(s) to the die attach pad(s). In the example of FIG. 2, the first and second semiconductor dies 201 and 204 are mounted to the die attach pad 200 of FIG. 2 at 504 in FIG. 1. The die attachment at 504 can be performed using any suitable adhesive attachment materials, soldering, etc. The method 500 continues at 506 in FIG. 5 with wire bonding. FIG. 2 shows one example where electrical connections are made by bond wires 208 between the semiconductor dies 201 and 204, as well as between the dies and the first portions 111, 121, 131 and 141 of respective ones of the device leads 110, 120, 130 and 140. The method 500 continues with molding at 508 in FIG. 5 to form the package structure 108 with opposite first and second sides 101 and 102, opposite third and fourth sides 103 and 104, and opposite fifth and sixth sides 105 and 106, as shown in FIGS. 1 and 3 above. The molding operation at 508 encloses the die attach pad 200, the first and second semiconductor dies 201 and 204, the bond wires 208 and inner portions of the leads. In one example, the method 500 also includes dam bar cutting at 510 to remove copper dam bar features between the lead locations of a repeating lead pitch pattern. During the molding at 508, the dam bar features (not shown) mitigate or prevent outflow of molding material, after which the dam bar features are removed at 510. At 512, the method 500 further includes lead trimming or cutting with a lead cut process that cuts ends of the leads, which leaves the generally flat leads as shown in the front view of FIG. 6. In certain implementations, the method 500 also includes removal of any included tie bars at 514.

The method 500 further includes lead forming at 516 and 518 to bend or otherwise form the external portions of the trimmed leads into non-planar shapes. In one example, the lead portions outside the package structure 108 are formed into gull wing shapes as seen in FIG. 1. Other shapes can be formed in other examples, such as J leads, combinations of gull wing and J leads, etc. The lead forming operation in one example is performed in two stages, including forming downwardly extending leads at 516 (e.g., first leads 110 and third leads 130 in the electronic devices 100 and 300 of FIGS. 1 and 3 above), followed by forming upwardly extending leads at 518 (e.g., second leads 120 and fourth leads 140). In another possible implementation, the leads are formed in a single bending or forming process using appropriate tooling.

FIGS. 7 and 8 show one example of a bend processing at 516 using an anvil 702 positioned below the first portions of the leads 110 and 130, a punch 704 positioned above the second portions of the leads 110 and 130, and a clamp 706 positioned above the first portions of the leads 110 and 130. FIG. 8 illustrates a bending process 800 using the tooling 702, 704 and 706, in which the punch 704 is moved downward along the direction of arrows 802. The downward movement of the punch 704 relative to the anvil 702 and the clamp 706 forms the first bends 114 and 134 between first and second portions of the first and third leads 110, 130 to bend the first lead 110 and the third lead 130 downward to extend the respective second lead portions from the respective first portions toward the plane of the first side 101 and away from the plane of the second side 102.

Figure 9:
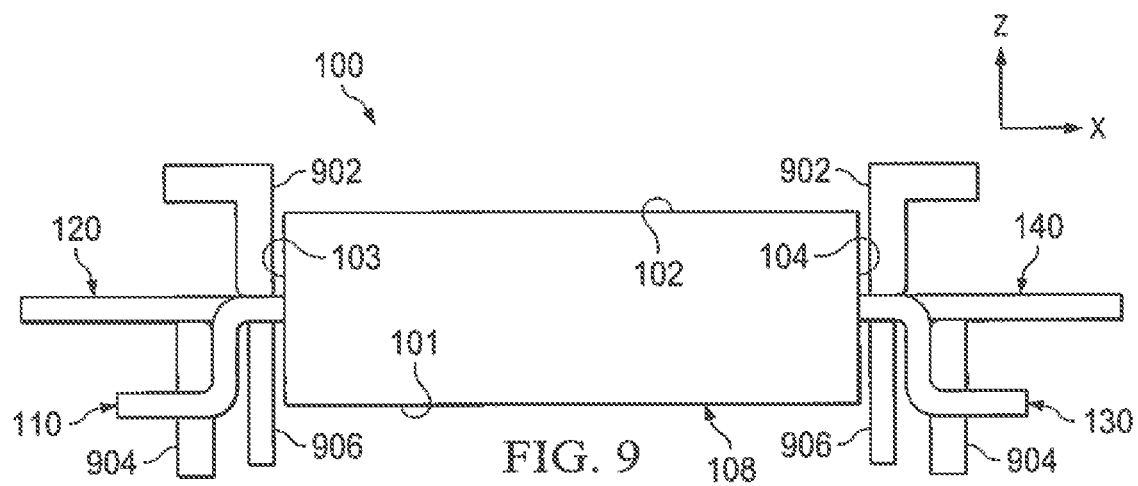
Figure 10:
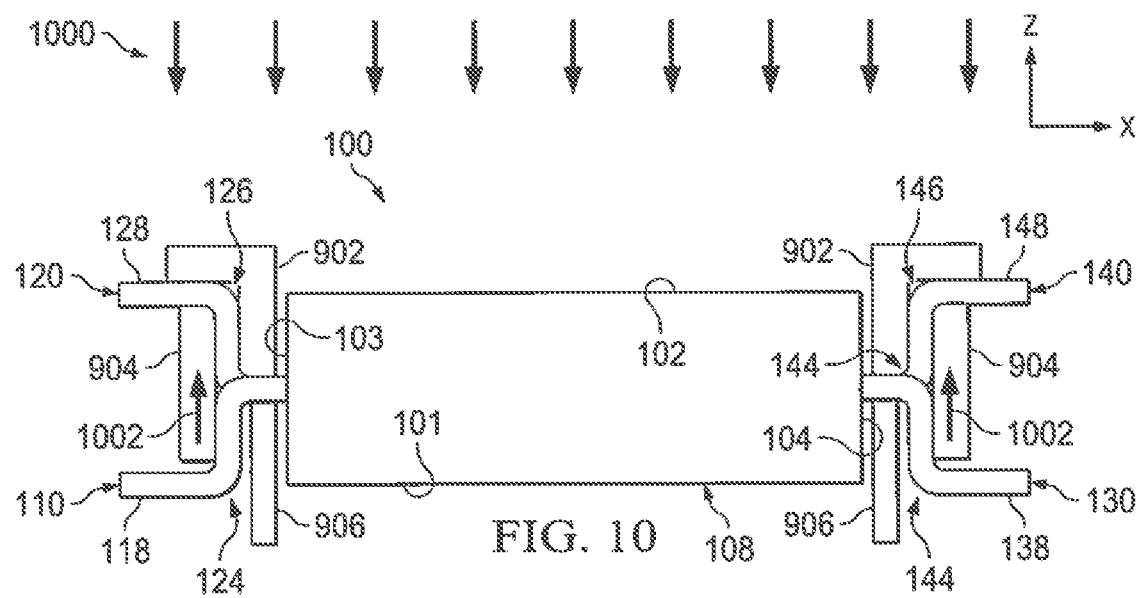

FIGS. 9 and 10 show one example of a bend processing at 518 using a second anvil 902 positioned above the first portions of the second and fourth leads 120 and 140, a second punch 904 positioned below the second portions of the leads 120 and 140, and a second clamp 906 positioned below the first portions of the leads 120 and 140. FIG. 10 illustrates a second bending process 1000 using the tooling 902, 904 and 906, in which the punch 904 is moved upward along the direction of arrows 1002 relative to the anvil 902 and the clamp 906 to form the first bends 124 and 124 between first and second portions of the respective second and fourth leads 120 and 140. This bends the second and fourth leads 120 and 140 upward to extend the respective second lead portions from the respective first portions toward the plane of the second side 102 and away from the plane of the first side 101.

Figure 11:
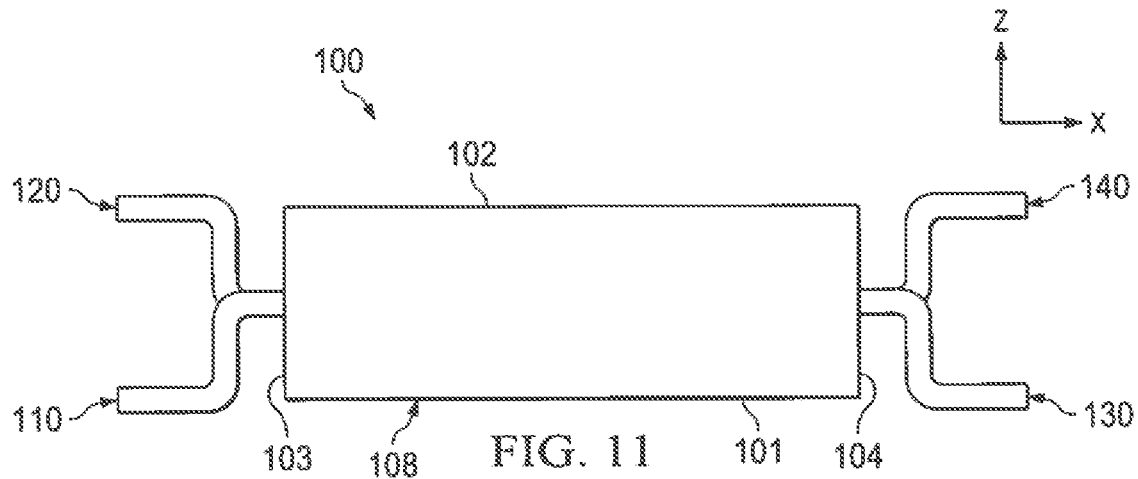

The resulting packaged electronic device 100 is shown in FIG. 11, with first and third downwardly extending gull wing leads 110 and 130 extending from the respective third and fourth sides 103 and 104, as well as the second and fourth upwardly extending gull wing leads 120 and 140 extending from the respective third and fourth sides 103 and 104. In other examples, the forming processing at 516 and 518 can be combined into a single process using suitable tooling that concurrently forms the upwardly extending and downwardly extending leads. In another example, one or more of the leads can be formed into different shapes, such as J-type leads that bend back over or below the respective top and/or bottom sides 102 and 101 of the package structure 108. In other implementations, moreover, leads can be formed on more than two sides of the package structure 108, or on a single side of the package structure 108. In another implementation, a particular side of the package structure can include only one or more upwardly extending leads, or the particular side can include only one or more downwardly extending leads.

Referring also to FIGS. 12-23, the method 500 in one example continues at 520, with connection of one or more additional circuits and/or components to the upwardly extending lead or leads (e.g., to the second leads 120 and/or the fourth leads 140). In one implementation, the additional circuit and/or component is soldered to the upwardly facing lead or leads (e.g., 120 and/or 140) of the packaged electronic device 100, 300 prior to connection (e.g., soldering) of the downwardly facing lead or leads (e.g., 110, 130) to a host printed circuit board (not shown). In another implementation, the packaged electronic device 100, 300 is soldered to a host PCB prior to connection of the additional circuit and/or component to the upwardly facing lead or leads. In other implementations, one or more additional circuits and/or components are connected to the upwardly facing lead or leads, followed by connection of one or more downwardly facing leads to a host PCB, after which further additional circuits and/or components can be connected to further upwardly facing leads.

In one example, the electrical connection of the additional circuits and/or components at 520 includes soldering of one or more conductive surfaces of the attached component or circuit to the second or fourth surface 128, 148 of the upwardly extending second and/or fourth leads 120, 140. In other examples, the electrical contact formed at 520 can be implemented through other techniques, such as sintering, spot welding, laser welding, or by using a range of conductive adhesives, or combinations of different attachment techniques that provide electrical and mechanical connection.

A variety of different electronic assemblies are possible using the described packaged electronic device structures, such as the devices 100 and 300, in combination with further packaged electronic devices, and/or passive electronic components, and/or printed circuit board assemblies. The described examples facilitate vertical integration to increase circuit density and functional density, while employing the mechanical robustness advantages of gull wing, and J-type, and other lead shapes. The described examples can be used in combination with other forms of vertical integration, such as stack packages in Digital Products using POP-BGA, or TSV configurations, while facilitating vertical integration of analog and power products, where lower pin count robust gull-wing packages are beneficial for accommodating shock and vibration affects seen in industrial, automotive, aviation and/or other applications. The disclosed examples facilitate integration of packaged electronics, such as integrated circuits, in combination with additional passive components, ICs, discrete devices, sensors, etc.

Gull wing and J-leaded packages have formed leads that span out of or above/below the package body and provide stress relief for high vibration and/or shock environments. These leads facilitate electrical contacts between a die in the package electronic device and an underlying PCB. In addition, the described examples also provide upwardly extending leads (e.g., gull wing and/or J-type leads) form certain leads in a different (opposite) direction with one or more leads facing up, while one or more other leads face down. This allows use of the down facing leads to contact a host PCB, or external components that are on the bottom side. In this regard, the upward facing leads can be used to provide mechanical support, as well as electrical contact to addition components that are stacked in the vertical direction, for example, passive components, other packaged electronic devices, printed circuit boards, etc.

The example electronic assemblies of FIGS. 12-23 include one or more packaged electronic devices, such as the devices 100 and 300 described above, or variants thereof, in addition to a circuit or component electrically connected to the second lead 120, the fourth lead 140, and/or two other upwardly extending lead of the package electronic device to form an electronic assembly. In various examples, the additional circuit or component is a second packaged electronic device (e.g., FIGS. 12, 16, 17, 22 and 23 below). In certain examples, the additional circuit or component is a passive circuit component, such as a resistor, inductor, capacitor, etc. (e.g., FIGS. 13, 14, 19, 21-23). In various examples, moreover, the additional circuit or component is a printed circuit board (e.g., FIGS. 15 and 23 below).

Figure 12:
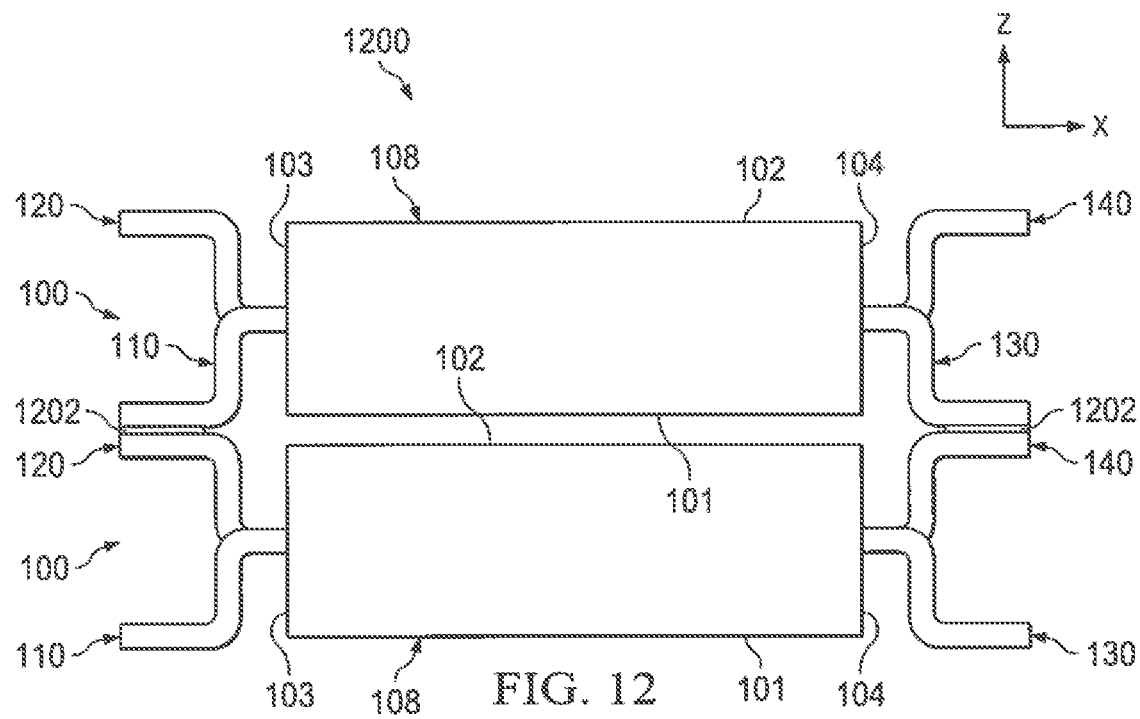
FIG. 12 is a side elevation view of an electronic assembly embodiment with two vertically stacked packaged electronic devices.

FIG. 12 shows an example electronic assembly 1200, including first and second, vertically stacked, packaged electronic devices 100 (FIGS. 1, 2 and 11). In this example, the lower first and third surfaces 118, 138 of the upper electronic device 100 are soldered, sintered, spot welded, laser welded, or glued using conductive adhesives, to the upward facing second and fourth surfaces 128, 148 of the respective second and fourth leads 120, 140 of the lower packaged electronic device 100. In the illustrated example, the devices 100 are joined using solder connections 1202.

Figure 13:
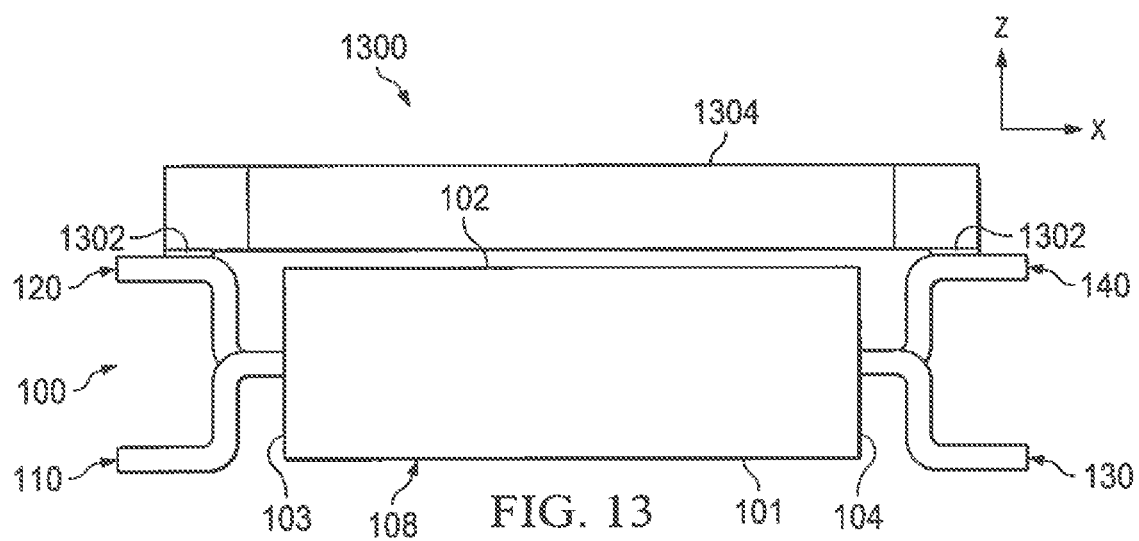
FIG. 13 is a side elevation view of another electronic assembly embodiment with a passive component connected to upper gull wing leads of the packaged electronic device of FIGS. 1 and 2.

FIG. 13 shows another example electronic assembly 1300 with solder 1302 connecting a passive component 1304 to upper gull wing leads 120, 140 of the packaged electronic device 100. In this example, the passive component 1304 is connected between the second lead 120 and the fourth lead 140. In another example configuration (e.g., FIG. 21 below), a passive component can be connected between a pair of second leads 120 along the third side 103 of the package electronic device 100 (e.g., or between a pair of fourth leads 140 along the fourth side 104). In various implementations, the upwardly extending leads can be positioned relative to one another in a given packaged electronic device design in order to accommodate various passive components of different sizes and configurations.

In one implementation, the electronic assembly 1300 is a signal-chain or power device with one or more passive components to increase functionality and performance with close coupling between the circuitry inside the packaged electronic device 100 and the passive component 1304, where the package electronic device 100 is an SOIC, a TSSOP or an SOT, and the passive component 1304 is an inductor, capacitor, sensor, crystal, antenna, battery, or other component.

Figure 14:
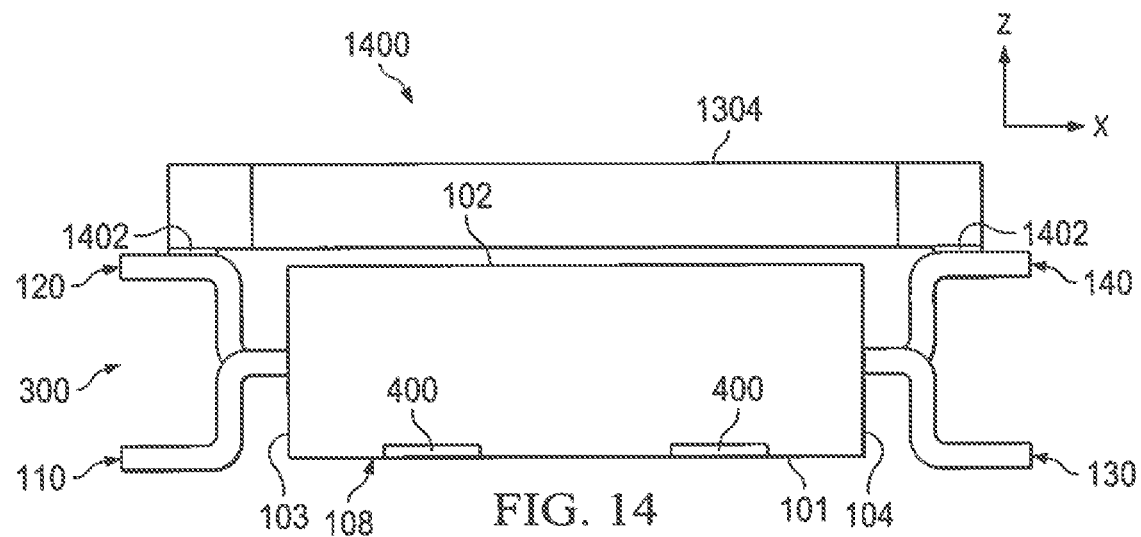
FIG. 14 is a side elevation view of another electronic assembly embodiment with a passive component connected to upper gull wing leads of the packaged electronic device of FIGS. 3 and 4.

FIG. 14 shows another electronic assembly example 1400 with a passive component 1304 (e.g., inductor, capacitor, sensor, crystal, antenna, battery, or other component) connected to upper gull wing leads of the packaged electronic device 300 of FIGS. 3 and 4. In one example, the electronic assembly 1400 is a half bridge power switching circuit with an inductor, including to lower thermal pads 400 (e.g., PowerPad) along the lower first side 101 of the packaged electronic device 300, where the electronic device 300 can be an HTSSOP an HTSOIC, an HTVSSOP, or a SOT, and the passive component 1304 is an inductor or a capacitor soldered to the upwardly facing leads using solder 1402.

Figure 15:
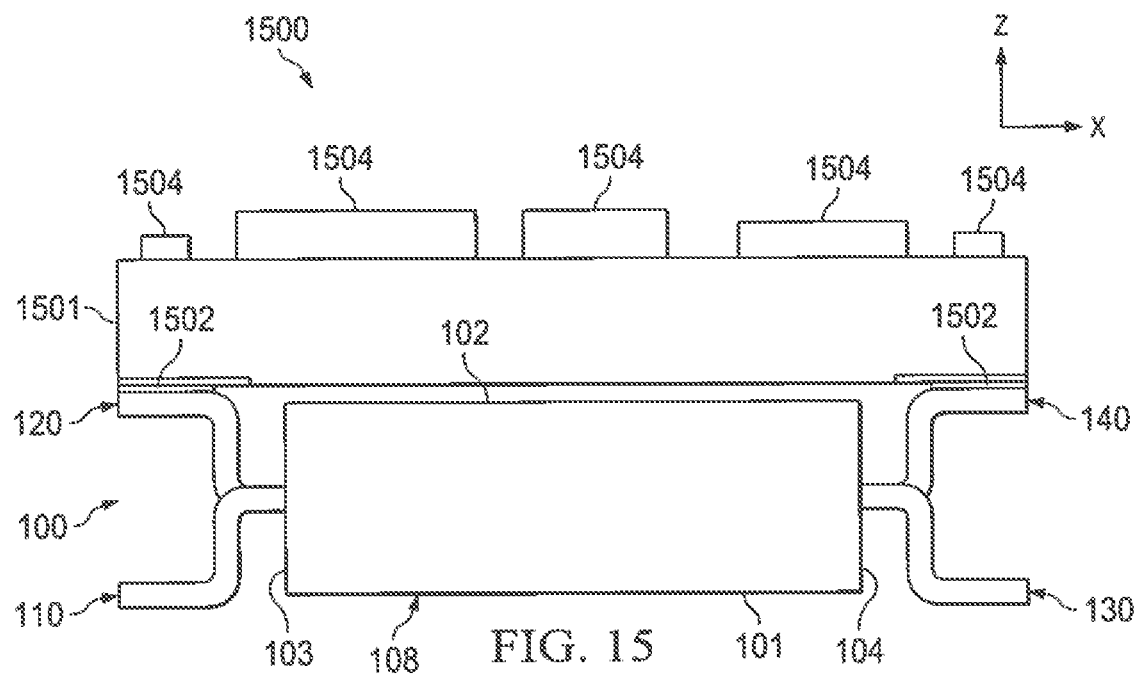
FIG. 15 is a side elevation view of another electronic assembly embodiment with a printed circuit board connected to upper gull wing leads of the packaged electronic device of FIGS. 1 and 2.

FIG. 15 shows another electronic assembly embodiment 1500 with a printed circuit board 1501 connected to upper gull wing leads of the packaged electronic device 100 of FIGS. 1 and 2 VS solder 1502. In this example, the printed circuit board 1501 includes one or more components 1504 mounted to a top side thereof. In one example, the packaged electronic device 100 is an SOIC, a TSSOP, or an SOT.

Figure 16:
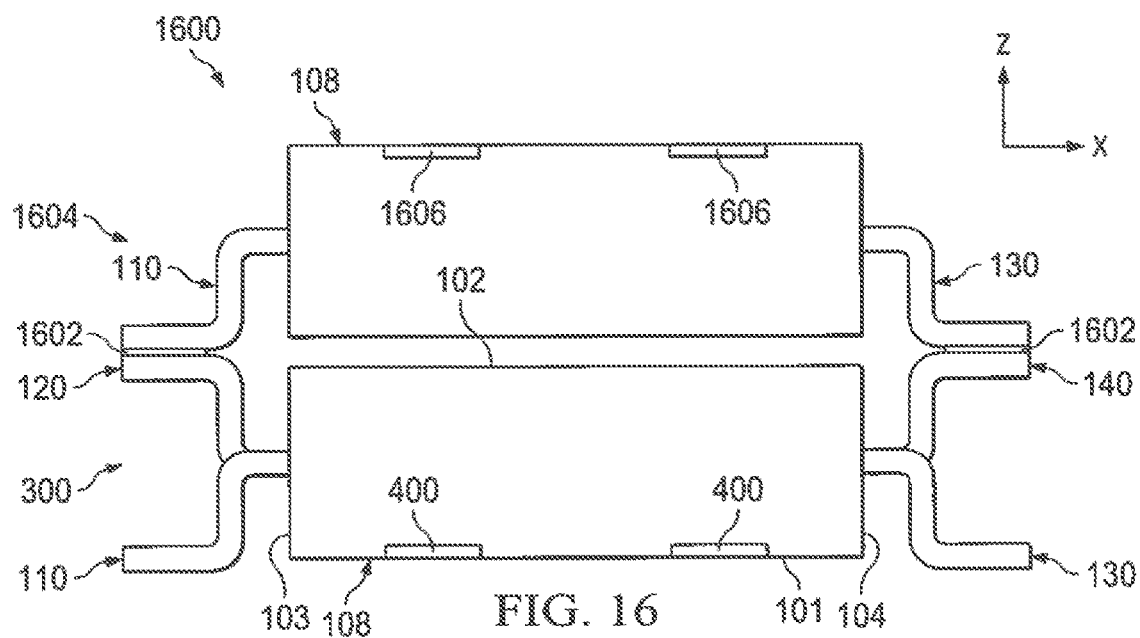
FIG. 16 is a side elevation view of another electronic assembly embodiment with two vertically stacked packaged electronic devices with thermal pads for upper and lower heat removal.

FIG. 16 shows another electronic assembly example 1600 with two vertically stacked packaged electronic devices with a solder 1602 connecting an upper electronic device 1604 and a lower electronic device 300. In this example, the lower electronic device 300 is as described above in connection with FIGS. 3 and 4 with multiple lower thermal pads 400 that can be soldered to a host PCB (not shown). The upper electronic device 1604 includes upper thermal pads 1606 that can be soldered to a heat sink or exposed to the ambient air. This example electronic assembly 1600 facilitates both upper and lower heat removal. In one example, one of the electronic devices 300, 1604 is a half bridge power switching circuit, and the other device 300, 1604 is a switching controller. In various implementations, the upper packaged device 1604 is an HTSSOP, or an HTSOIC, or an HTVSSOP, or a SOT, and the lower packaged device 300 is an RHTSSOP, or an RHTSOIC, or an RHTVSSOP, or a SOT.

Figure 17:
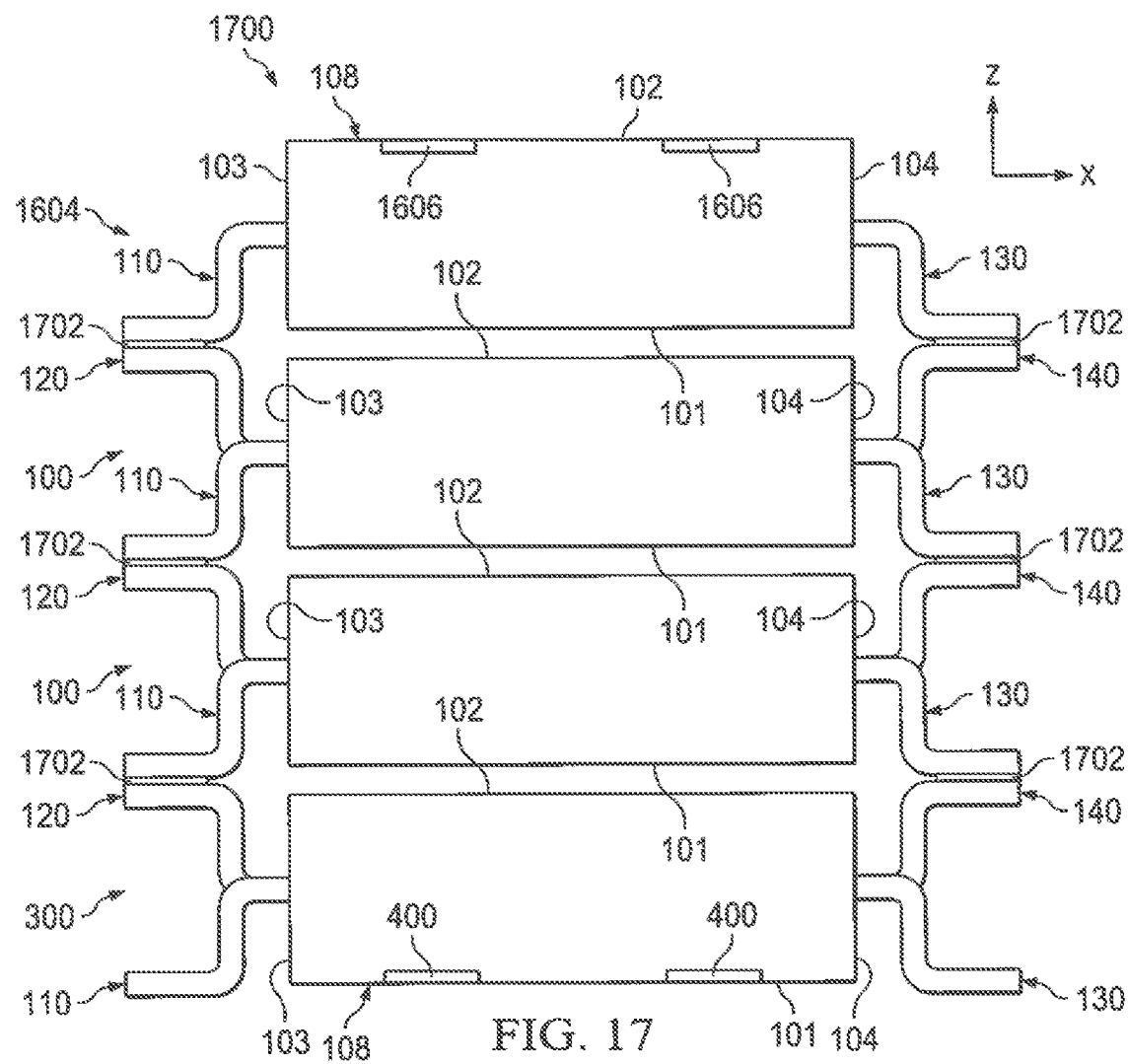
FIG. 17 is a side elevation view of another electronic assembly embodiment with four vertically stacked packaged electronic devices with thermal pads for upper and lower heat removal.

FIG. 17 shows another example electronic assembly 1700 with four vertically stacked packaged electronic devices joined by solder 1702 to form a multiphase switched power supply. The lowermost electronic device 300 (e.g., an HTSSOP, HTSOIC, HTVSSOP, or SOT) includes bottom-side thermal pads 400 as described above in connection with FIGS. 3 and 4. The two middle packaged electronic devices 100 (e.g., TSSOP, SOIC, TVSSOP, or SOT) are generally as described above in connection with FIGS. 1 and 2, and the uppermost electronic device 1604 (e.g., RHTSSOP, RHTSOIC, RHTVSSOP, or SOT) includes upper thermal pads 1606 four ambient cooling or attachment to a heat sink device, for example, as described above in connection with FIG. 16.

Figure 18:
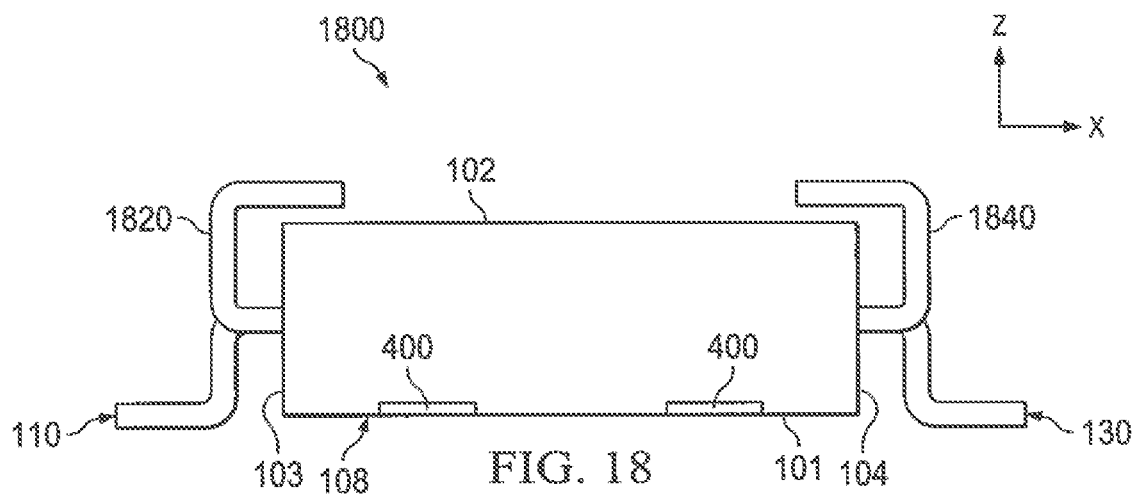
FIG. 18 is a side elevation view of a packaged electronic device with upper J-type leads, lower gull wing leads, and lower thermal pads according to another embodiment.
Figure 19:
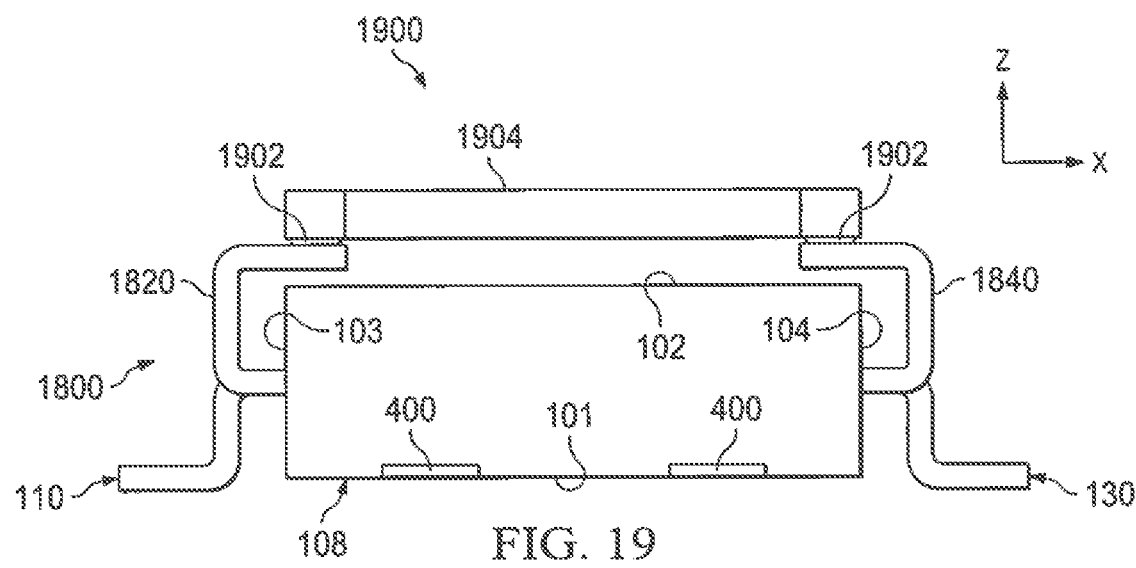
FIG. 19 is a side elevation view of another electronic assembly embodiment with a passive component connected to upper J-type leads of the packaged electronic device of FIG. 18.

FIG. 18 shows another example packaged electronic device 1800 with lower (e.g., downwardly facing) gull wing leads 110 and 130 that extend outwardly relative to the package structure 108 below the plane of the first side 101 as described above. The packaged electronic device 1800 further includes upper (e.g., upwardly extending) J-type leads that extend inwardly relative to the package structure 108 at least partially above the plane of the upper second side 102. This example includes lower gull wing leads as previously described, as well as lower thermal pads 400. FIG. 19 shows another electronic assembly embodiment 1900 with solder 1902 that connects a passive component 1904 connected to the upper J-type leads of the packaged electronic device 1800 of FIG. 18.

Figure 20:
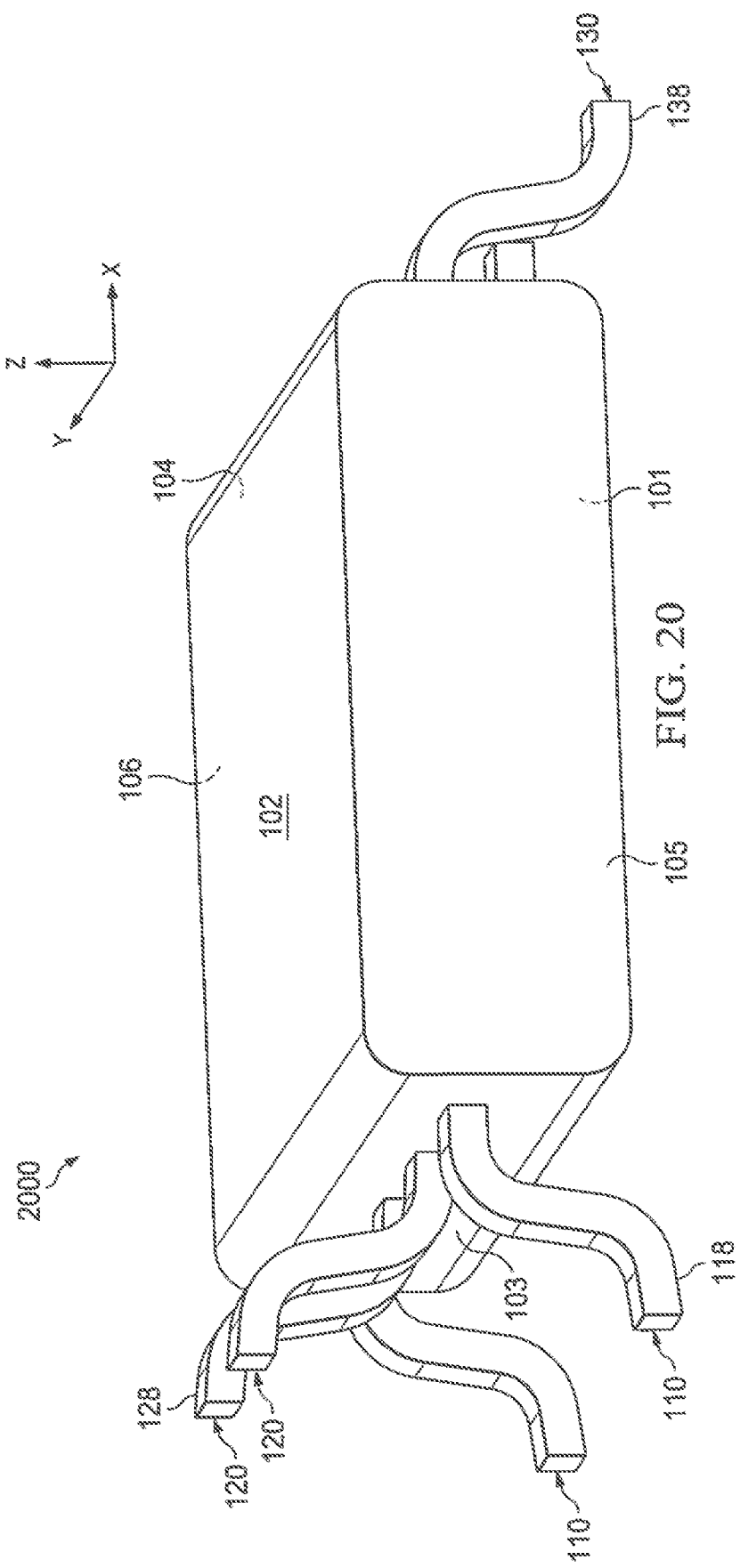
FIG. 20 is a perspective view of another packaged electronic device embodiment with upper and lower gull wing leads on one side according to another embodiment.
Figure 21:
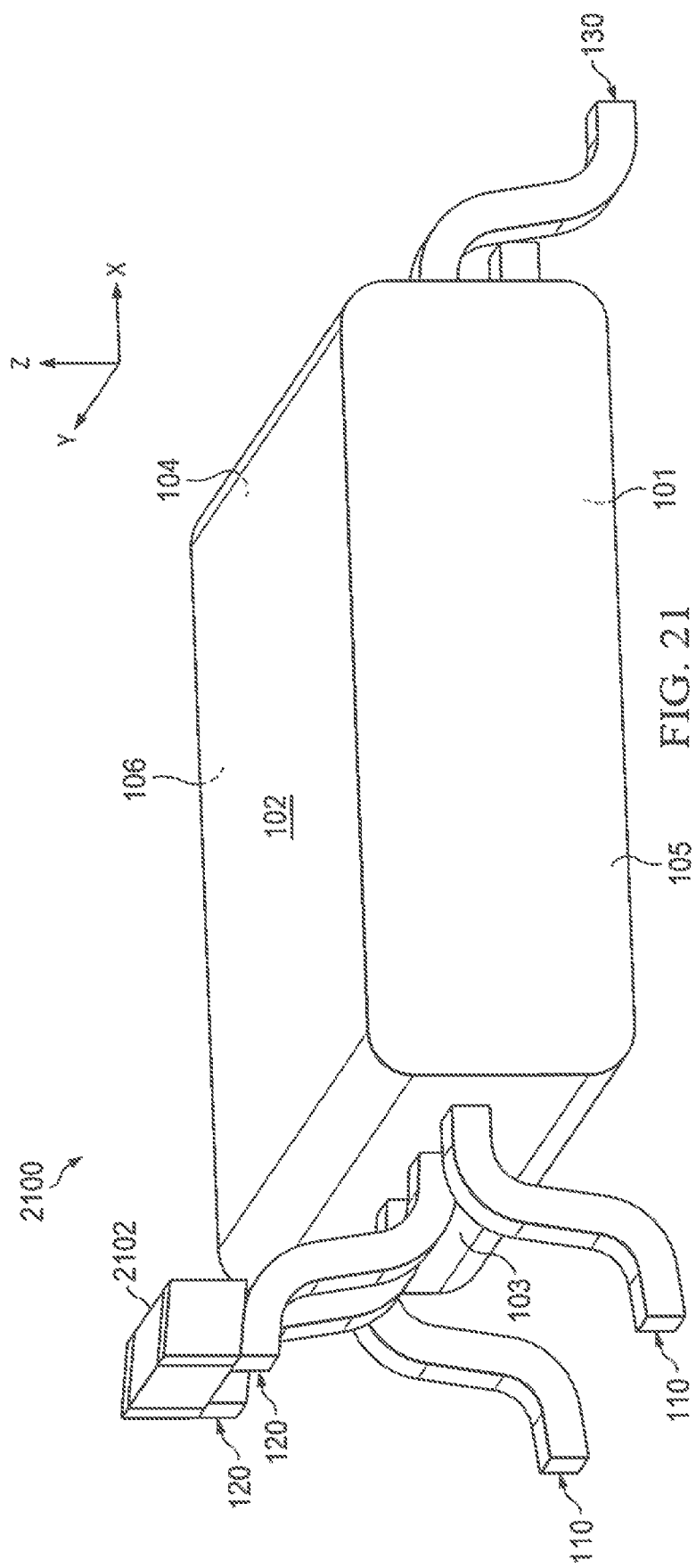
FIG. 21 is a perspective view of another electronic assembly embodiment with a passive component connected to the upper gull wing leads of the packaged electronic device of FIG. 20.

FIG. 20 shows another packaged electronic device example 2000 with upper gull wing leads 120 on only the third side 103, as well as downwardly extending lower first and third gull wing leads 110 and 130. FIG. 21 shows another electronic assembly example 2100, including a passive component 2102 connected to the upper gull wing leads 120 of the packaged electronic device 2000 of FIG. 20.

Figure 22:
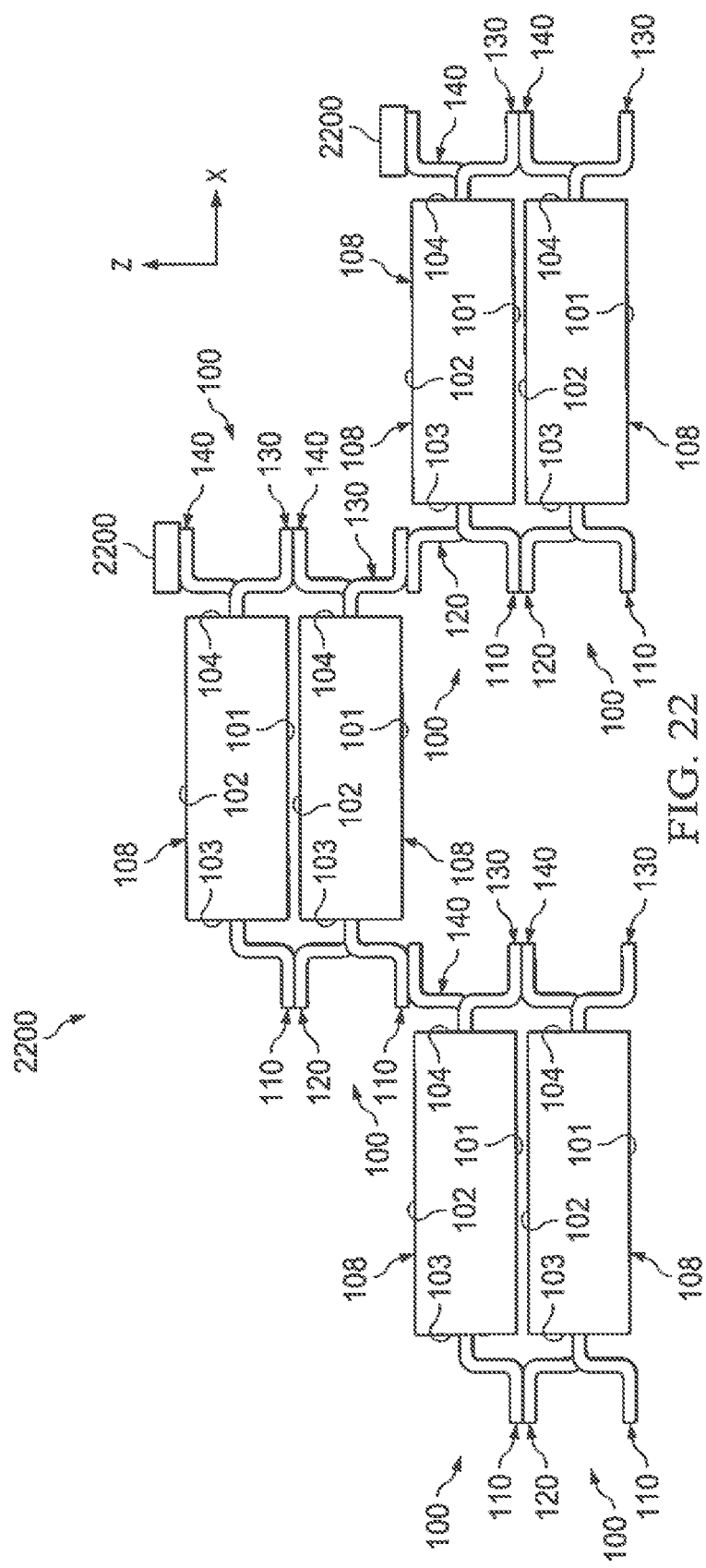
FIG. 22 is a side elevation view of another electronic assembly embodiment with multiple stacked packaged electronic devices and passive components.

FIG. 22 shows another electronic assembly example 2200 with multiple stacked packaged electronic devices 100 as described in connection with FIGS. 1 and 2 above, as well as and passive components 2200 soldered to upwardly extending fourth leads 140 of certain of the electronic devices 100. In this example, one of the electronic devices 100 includes downwardly extending leads connected to two different electronic devices 100. In this example, moreover, the topmost electronic device 100 includes upwardly extending leads 140 on only a single side 104.

Figure 23:
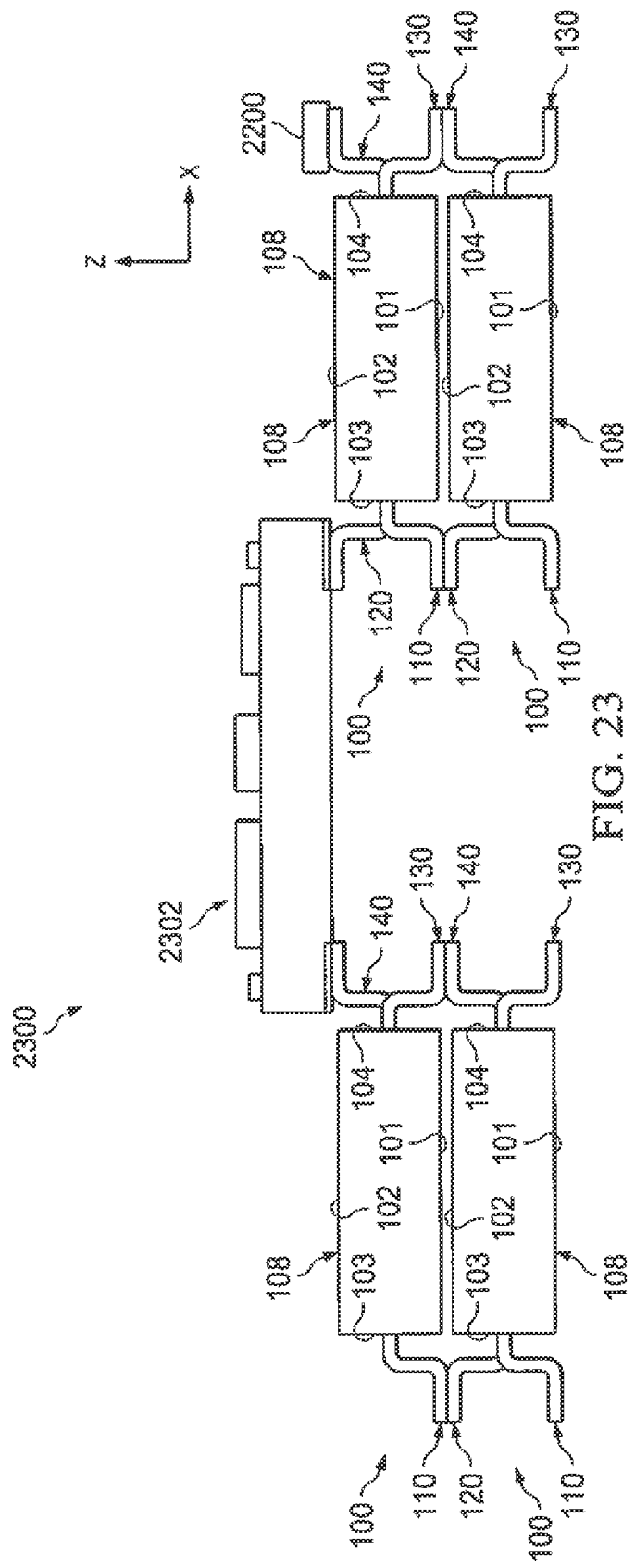
FIG. 23 is a side elevation view of another electronic assembly embodiment with multiple stacked packaged electronic devices and a printed circuit board.

FIG. 23 shows another electronic assembly example 2300 with two stacks of packaged electronic devices 100 and a printed circuit board with lower circuit board pads connected to upwardly extending fourth leads 140 of the uppermost device 100 in each of the two stacks.

A large number of other combinations and electronic assembly implementations are possible using the packaged electronic device examples. Disclosed examples facilitate three-dimensional integration to improve functional density in the application with more operations in a given area on host PCB. In various implementations the separate components be manufactured (or sourced) separately but can be tested and calibrated together. For example, the components assembled into an electronic assembly can be trimmed and pre-calibrated (e.g., at final test), while the separate manufacturing of the individual components can facilitate cost reduction, while providing high-performance of the final electronic assembly. Passive components such as crystals, inductors, and capacitors can be tightly coupled by direct connection to packaged device leads without having to route associated signals through a PCB trace, thereby facilitating use in high-frequency circuits, clock circuits, etc. The flexibility of the electronic device examples allows mixing and matching of a variety of functions and ratings (e.g., voltage, power, current, etc.) by selection of components for use in a given final electronic assembly to meet the needs of a variety of end applications. Moreover, the use of the lowermost downwardly extending leads (e.g., gull wing, J-type, etc.) facilitates high reliability needs of industrial, automotive, avionics, and infrastructure applications, such as integrated power supply circuits with attached batteries, photocells, sensors, etc. to enable autonomous products that can self-power for a long time.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A method, comprising:
   forming a package structure to enclose portions of a first lead and a second lead, the package structure including opposite first and second sides spaced apart from one another along a first direction, and opposite third and fourth sides spaced apart from one another along a second direction orthogonal to the first direction;
   bending the first lead downward toward a plane of the first side and away from a plane of the second side; and
   bending the second lead upward toward the plane of the second side and away from the plane of the first side, wherein the first lead and the second lead are on a same side of the package structure.

2. The method of claim 1,
   wherein bending the first lead downward includes:
      forming a first bend between first and second portions of the first lead to extend the second portion from the first portion toward the plane of the first side and away from the plane of the second side, and
      forming a second bend between the second portion of the first lead and a third portion of the first lead to space a first surface of the third portion apart from and beyond the plane of the first side; and
   wherein bending the second lead upward includes:
      forming a first bend between first and second portions of the second lead to extend the second portion from the first portion toward the plane of the second side and away from the plane of the first side, and
      forming a second bend between the second portion of the second lead and a third portion of the second lead to space a second surface of the third portion apart from and beyond the plane of the second side.

3. The method of claim 1, further comprising:
   connecting an additional circuit or component to the second lead.

4. A method, comprising:
   forming a package structure, including a first side, a second side spaced apart from the first side along a first direction, a third side, and a fourth side spaced apart from the third side along a second direction, the second direction orthogonal to the first direction;
   forming a first lead, including:
      a first portion extending outward from the third side along the second direction,
      a second portion extending from the first portion toward a plane of the first side and away from a plane of the second side, and
      a third portion extending from the second portion, and including a first surface spaced apart from and beyond the plane of the first side; and
   forming a second lead, including:
      a first portion extending outward from the third side along the second direction,
      a second portion extending from the first portion toward the plane of the second side and away from the plane of the first side, and
      a third portion extending from the second portion and toward the package structure, and including a second surface spaced apart from and beyond the plane of the second side.

5. The method of claim 4, further comprising:
   forming a third lead, including:
      a first portion extending outward from the fourth side along the second direction,
      a second portion extending from the first portion toward the plane of the first side and away from the plane of the second side, and
      a third portion extending from the second portion, and including a third surface spaced apart from and beyond the plane of the first side.

6. The method of claim 5, further comprising:
   forming a fourth lead, including:
      a first portion extending outward from the fourth side along the second direction,
      a second portion extending from the first portion toward the plane of the second side and away from the plane of the first side, and
      a third portion extending from the second portion and toward the package structure, and including a fourth surface spaced apart from and beyond the plane of the second side.

7. The method of claim 6, wherein the third portions of the respective first and third leads extend from the second portion away from the package structure to form gull wing lead shapes for the respective second and fourth leads.

8. The method of claim 6, wherein the third portions of the respective second and fourth leads extend from the second portion toward the package structure to form J-lead shapes for the respective second and fourth leads.

9. The method of claim 6, comprising:
   forming multiple first leads, each respective first lead including a first portion extending outward from the third side, a second portion extending from the first portion toward the plane of the first side and away from the plane of the second side, and a third portion extending from the second portion, the third portion including a first surface spaced apart from and beyond the plane of the first side;
   forming multiple second leads, each respective second lead including a first portion extending outward from the third side along the second direction, a second portion extending from the first portion toward the plane of the second side and away from the plane of the first side, and a third portion extending from the second portion and toward the package structure, the third portion including a second surface spaced apart from and beyond the plane of the second side;

forming multiple third leads, each respective third lead including a first portion extending outward from the fourth side along the second direction, a second portion extending from the first portion toward the plane of the first side and away from the plane of the second side, and a third portion extending from the second portion, the third portion including a third surface spaced apart from and beyond the plane of the first side; and forming multiple fourth leads, each respective fourth lead including a first portion extending outward from the fourth side along the second direction, a second portion extending from the first portion toward the plane of the second side and away from the plane of the first side, and a third portion extending from the second portion and toward the package structure, the third portion including a fourth surface spaced apart from and beyond the plane of the second side.

10. The method of claim 5, wherein the third portions of the respective first and third leads extend from the second portion away from the package structure to form gull wing lead shapes for the respective first and third leads.

11. The method of claim 10, wherein the third portion of the second lead extends from the second portion toward the package structure to form a J-lead shape for the second lead.

12. The method of claim 4, wherein the third portion of the second lead extends from the second portion toward the package structure to form a J-lead shape for the second lead.

13. The method of claim 4, comprising:
forming multiple first leads, each respective first lead including a first portion extending outward from the third side, a second portion extending from the first portion toward the plane of the first side and away from the plane of the second side, and a third portion extending from the second portion, the third portion including a first surface spaced apart from and beyond the plane of the first side; and forming multiple second leads, each respective second lead including a first portion extending outward from the third side along the second direction, a second portion extending from the first portion toward the plane of the second side and away from the plane of the first side, and a third portion extending from the second portion, the third portion including a second surface spaced apart from and beyond the plane of the second side.

14. A method of making an electronic assembly, comprising:
forming a packaged electronic device, including:
forming a package structure including opposite first and second sides spaced apart from one another along a first direction, and opposite third and fourth sides spaced apart from one another along a second direction orthogonal to the first direction,
forming a first lead including a first portion that extends outward from the third side of the package structure, the first lead extending downward toward a plane of the first side and away from a plane of the second side, and
forming a second lead including a first portion that extends outward from the third side of the package structure, the second lead extending upward toward the plane of the second side and away from the plane of the first side; and
directly electrically connecting a component to the second lead.

15. The method of claim 14, wherein the component directly electrically connected to the second lead is a second packaged electronic device.

16. The method of claim 15, wherein the component directly electrically connected to the second lead is a passive circuit component.

17. The method of claim 15, wherein the component directly electrically couples together two leads of the packaged electronic device.

18. The method of claim 14, wherein forming the packaged electronic device further includes:
forming multiple first leads, each respective first lead including a first portion extending outward from the third side, a second portion extending from the first portion toward the plane of the first side and away from the plane of the second side, and a third portion extending from the second portion, the third portion including a first surface spaced apart from and beyond the plane of the first side; and forming multiple second leads, each respective second lead including a first portion extending outward from the third side along the second direction, a second portion extending from the first portion toward the plane of the second side and away from the plane of the first side, and a third portion extending from the second portion, the third portion including a second surface spaced apart from and beyond the plane of the second side.

19. The method of claim 8, wherein J-lead shape does not contact the package structure.

20. The method of claim 14, wherein the third portion of the second lead extends from the second portion toward the package structure to form a J-lead shape for the second lead.

21. A method of making an electronic device, comprising:
forming a package structure, including a first side, a second side spaced apart from the first side along a first direction, a third side, and a fourth side spaced apart from the third side along a second direction, the second direction orthogonal to the first direction;
forming a first lead, including:
forming a first portion extending outward from the third side along the second direction,
forming a second portion extending from the first portion toward a plane of the first side and away from a plane of the second side, and
forming a third portion extending from the second portion, and including a first surface spaced apart from and beyond the plane of the first side;
forming a second lead, including:
forming a first portion extending outward from the third side along the second direction,
forming a second portion extending from the first portion toward the plane of the second side and away from the plane of the first side, and
forming a third portion extending from the second portion and toward the package structure, and including a second surface spaced apart from and beyond the plane of the second side; and
wherein no portion of any lead extending outward from the fourth side extends toward the plane of the second side.

* * * * *